US006920182B2

(12) United States Patent
Bolton, Jr.

(10) Patent No.: US 6,920,182 B2
(45) Date of Patent: Jul. 19, 2005

(54) DELTA-SIGMA MODULATOR SYSTEM AND METHOD

(75) Inventor: Jerry Thomas Bolton, Jr., Plano, TX (US)

(73) Assignee: Microtune (Texas), L.P., Plano, TX (US)

( * ) Notice: Subject to any disclaimer, the term of this patent is extended or adjusted under 35 U.S.C. 154(b) by 774 days.

(21) Appl. No.: 09/757,798

(22) Filed: Jan. 9, 2001

(65) Prior Publication Data

US 2002/0121994 A1 Sep. 5, 2002

(51) Int. Cl.[7] ................................................ H03M 3/02
(52) U.S. Cl. ...................................... 375/247; 341/143
(58) Field of Search ................................. 375/247, 316; 341/143, 144

(56) References Cited

U.S. PATENT DOCUMENTS

| | | | |
|---|---|---|---|
| 4,748,626 A | | 5/1988 | Wong |
| 4,873,688 A | | 10/1989 | Maki et al. |
| 4,920,544 A | * | 4/1990 | Endo et al. ................. 375/243 |
| 5,173,695 A | | 12/1992 | Sun et al. |
| 5,191,332 A | | 3/1993 | Shieu |
| 5,196,850 A | * | 3/1993 | Duffy et al. .................. 341/76 |
| 5,414,424 A | * | 5/1995 | Cabler ......................... 341/143 |
| 5,648,779 A | * | 7/1997 | Cabler ......................... 341/143 |
| 5,760,722 A | * | 6/1998 | Harris et al. ................. 341/143 |
| 5,896,056 A | | 4/1999 | Glucina |
| 6,067,036 A | | 5/2000 | Mauthe et al. |
| 6,175,728 B1 | * | 1/2001 | Mitama ....................... 455/323 |
| 6,255,977 B1 | * | 7/2001 | Jelonnek et al. ............ 341/143 |
| 6,373,417 B1 | * | 4/2002 | Melanson ................... 341/143 |
| 6,469,684 B1 | * | 10/2002 | Cole ............................ 345/58 |
| 6,538,589 B2 | * | 3/2003 | Okuda et al. ............... 341/143 |
| 6,570,452 B2 | * | 5/2003 | Sridharan ................... 331/1 A |
| 6,570,518 B2 | * | 5/2003 | Riley et al. ................. 341/143 |
| 6,717,998 B2 | * | 4/2004 | Adachi et al. .............. 375/376 |

FOREIGN PATENT DOCUMENTS

| | | |
|---|---|---|
| EP | 0 450 984 | 10/1991 |
| EP | 0840485 | 5/1998 |
| WO | WO 01/17116 | 3/2001 |

OTHER PUBLICATIONS

DSPatch, The Digital Signal Processing Applications Newsletter, "Sigma–Delta Conversion Technology", Winter 1990, pp. 1–15.

Candy, James C. et al; "Oversampling Methods for A/D and D/A Converstion", pp. 1–29.

Norsworthy, Steven R.; AT&T Laboratories Allentown Pennsylvania; "Effective Dithering of Sigma–Delta Modulators," 1992; pp. 1304–1307.

Microwaves & RF; "Technique Enhances The Performance of PLL Synthesizers," Jan. 1993; pp. 61–64.

Hill, Cris: Sciteq/Osicom; Applied Microwave & wireless "All Digital Fractional–N Synthesizer for High Resolution Phase Locked Loops"; Nov.–Dec. 1997; pp. 62–69.

Miller, Brian et al; IEEE; "A Multiple Modulator Fractional Divider"; 1990; pp. 559–568.

(Continued)

Primary Examiner—Young T. Tse
(74) Attorney, Agent, or Firm—Fulbright & Jaworski LLP

(57) ABSTRACT

The invention discloses a system and method for improving the out-of-band noise response of a multi-order delta-sigma modulator. The system and method includes programmable delta-sigma modulators which may be programmed to vary the reference signals at each modulator stage subsequent to the first stage relative to the reference signal of the first modulator stage. The resulting signal output will then typically exhibit the enhanced noise suppression characteristics of a dithered signal without the added circuitry and power required of a dithering apparatus.

23 Claims, 8 Drawing Sheets

OTHER PUBLICATIONS

Filiol, Norman et al; IEEE Journal of Solid–State Circuits vol. 33 No. 7; "An Agile ISM Band Frequency Synthesizer with Built–In GMSK Data Modulator"; Jul. 1998; pp. 998–1008.

Riley, Tom et al; IEEE Journal of Solid–State Circuits vol. 28 No. 5 "Delta–Sigma Modulation in Fractional–N Frequency Synthesis"; May 1993; pp. 553–559.

Erickson, Grant; Department of Electrical Engineering Univ. of Minnesota; "A Fundamental Introduction to the Compact Disc Player"; Nov. 29, 1994; pp. 1–19.

Foreign Search Report, dated Feb. 4, 2004, 3 pages.

Noel Boutin, University of Sherbrooke, RF Design, rf featured technology, "Complex Signals: Part 1," Dec. 1989, pp. 27–33.

Noel Boutin, University of Sherbrooke, RF Design, rf signals, "Complex Signals: Part II," Jan. 1990, pp. 57–64, 66.

Noel Boutin, University of Sherbrooke, RF Design, rf signals, "Complex Signals: Part III, Frequency Shifting Complex Signals," Mar. 1990, pp. 109–111, 113–115.

Noel Boutin, University of Sherbrooke, RF Design, rf signals, "Complex Signals: Part IV," May 1990, pp. 65–70, 73–75.

Shoji Otaka, et al., 1994 IEEE, 1994 Bipolar/BiCMOS Circuits & Technology Meeting, "A Low Local Input Power 1.9 GHz Si–Bipolar Quadrature Modulator without Any Adjustment," 1994, pp. 171–174.

Angel Boveda, et al., 1993 IEEE, ISSCC 93/Session 9/Radio Communication Circuits/Paper TP 9.3, "TP 9.3: A 0.7–3GHz GaAs QPSK/QAM Direct Modulator," 1993, pp. 142–143.

D. Stoneback, et al., "Distortion Beat Characterization and the Impact on QAM BER Performance," pp. 1–27.

* cited by examiner

DELTA-SIGMA MODULATOR SYSTEM AND METHOD

TECHNICAL FIELD

This invention generally relates to signal processing and in particular to the use of delta-sigma modulation.

BACKGROUND

Delta-sigma modulation is used widely throughout signal processing applications. Any application that requires signal modulation may generally take advantage of delta-sigma modulation techniques. The basic digital-to-analog and analog-to-digital conversion capabilities of a delta-sigma modulator along with its superior linearity and noise-shaping attributes find extensive functionality in digital and analog signal processing for audio or speech applications as well as telecommunication and signal acquisition technologies. Delta-sigma modulation can be found in audio conversion applications for communication transmission, ISDN applications, modems, audio play-back equipment such as compact disc (CD) or digital versatile/video disc (DVD) players, signal or frequency synthesizers, or any other application or equipment which utilizes modulation or demodulation.

In its basic block components, as shown in FIG. 1A, a first-order analog delta-sigma modulator comprises summer 100, integrator 101, Analog-to-Digital Converter (ADC) 102, which is set to a specific reference signal, and feedback loop 103 containing Digital-to-Analog Converter (DAC) 104 to provide the feedback signal. ADC 102 is typically configured as a comparator, which produces a quantized output using a set reference signal, while DAC 104 typically matches the bit size resolution of ADC 102 and uses the same reference signal. Low resolution ADCs and DACs are typically used because they are easier to implement at the necessary high sampling rates. In a general example using a 1-bit ADC, there will be a considerable amount of quantization error as a continuous analog signal is converted into a 1-bit digital signal limited by the fixed reference signal. This 1-bit output is then typically converted back to an analog signal through DAC 104 in feedback loop 103 and subtracted from the analog input signal at summer 100. The resulting error output of summer 100 is then usually integrated and fed back into the 1-bit ADC 102. This differential error feedback process generally keeps the output proportional to the input over the average of large sampling intervals.

A first order delta-sigma modulator may also be built in the digital domain. In this digital domain circuit, the input would typically be a large wordlength digital number that is quantized to a smaller wordlength number at the output (typically one bit). In the digital domain circuit, ADC 102 is normally replaced by a quantizer that truncates the lower least significant bits (LSBs) of the output of the digital integrator. Because this circuit is meant to operate in the digital domain, there will be no DAC 104 in the feedback path.

FIG. 1B illustrates the digital domain version of a delta-sigma modulator. The output signal is subtracted from the input signal at digital summer 110. The resulting signal is then integrated at digital integrator 111. The integrated signal is then quantized at quantizer 112 before being provided as output and as a feedback signal to digital summer 110.

For quantizing analog or digital signals, a delta-sigma modulator operates to quantize the signal at an extremely low resolution (e.g., 1-bit) using an extremely high sampling rate (e.g., 2 MHz). It is able to achieve the required resolution of Signal-to-Noise ratio (SNR) by exploiting two principles: (1) oversampling of the input signal to reduce the quantization noise floor introduced by the coarse quantizer; and (2) high pass noise shaping of this quantization noise to reduce this noise even further in the frequency band of interest.

The beneficial characteristics of the delta-sigma modulator due to oversampling result from application of the Nyquist Theorem. The Nyquist Theorem generally states that an input signal must be bandlimited to a frequency less than one-half of the sampling rate in order to avoid aliasing. In other words, the minimum sampling rate must be, at least, twice the input signal's bandwidth. This minimum sampling rate is known in the art as the Nyquist rate. Aliasing typically is the transposition of input frequency components greater than one-half of the Nyquist rate onto the lower frequencies. For example, with a sampling rate of 100 kHz, an input signal with frequency content from 0 to 60 kHz will transpose or overlap frequency components onto the input signal between 40 and 50 kHz. The addition of those aliased frequency components typically creates noise in the sampled signal and will generally prevent recovery of the information contained between 40 and 50 kHz in the original signal.

The quantization error resulting from the analog-to-digital conversion is typically known as quantization noise. Because of the complexity of this quantization noise, it is usually very difficult to accurately represent mathematically. In typical signal processing applications, the standard practice is to represent this quantization noise as white noise that is uncorrelated with the input. White noise is generally understood as noise that contains components across all frequencies and which is typically represented with a constant value in the frequency spectrum. This assumption simplifies the analysis for delta-sigma modulator design.

If white noise is sampled at a frequency of $f_s$, all of its noise power falls into the frequency band of $0<=f<f_s/2$ due to aliasing of frequencies greater than the Nyquist rate. This effect typically leads to the well-known result of the quantization noise power spectral density being given by the formula:

$$e^2(f) = 2e_{ms}^2/f_s = e_{ms}^2 2\tau \qquad (1)$$

where $e^2(f)$ is the power spectral density of the quantization noise, $e_{ms}^2$ is the total quantization noise power, and $\tau$ is the sampling period, $1/f_s$. Equation 1 shows that a higher sampling rate reduces the power spectral density. In other words, oversampling may further reduce the noise floor as the sampling rate increases above the Nyquist rate. Consider, for example, a signal within a frequency band of interest of $0<=f<f_o$. The signal is sampled at a rate of $f_s$. The example further assumes that the quantization error is sufficiently white, distributed uniformly, and uncorrelated to the signal frequency. In this scenario, the noise power falling into the band of interest can be represented by the formula:

$$n_o^2 = \int_o^{f_o} e^2(f) df = e_{rms}(2f_o\tau) = \frac{e_{rms}^2}{OSR} \qquad (2)$$

Where $n_o^2$ is the in-band noise power, $2f_o$ is the Nyquist rate, $\tau$ is the encoding/sampling period, and OSR is the over sampling ratio calculated according to the formula:

$$OSR = \frac{f_s}{2f_o} = \frac{1}{2f_o}\tau \qquad (3)$$

As equations 2 and 3 provide, doubling the encoding/sampling frequency $f_s$ decreases the in-band noise by 3 dB. This reduction in noise corresponds to an increase in signal-to-noise ratio, which, in turn, increases the resolution.

The main benefit of the delta-sigma modulator architecture is generally the noise shaping function exhibited by its circuit design. In order to better view this favorable quality, one must normally examine the delta-sigma modulator in the frequency domain. FIG. 2 illustrates the frequency domain linearized model for a basic, first-order delta-sigma modulator. Summer 200 is already linearized. The integrator is typically given the frequency domain representation of analog filter 201. Analog filter 201 generally exhibits a transfer function inversely proportional to the input frequency. The quantizer is usually broken into two elements in the frequency domain. The first element is generally modeled as gain block 202, which is then usually followed by summer 203 which adds quantization noise 204 to the filtered/integrated signal. This configuration, which adds quantization noise 204 after analog filter 201, but before feedback loop 205, is generally important to the operation of the delta-sigma modulator.

Mathematical analysis of the frequency domain linearized model generally illustrates the noise shaping characteristics of the delta-sigma modulator. Assuming, for purposes of this example analysis, that gain block 202 is configured for a gain of one, the output of the delta-sigma modulator can generally be shown mathematically as:

$$Y = \frac{(X - Y)}{f} = N_q \qquad (4)$$

Where Y represents the output of the modulator, X represents the input signal, f represents the frequency, and Nq represents the quantization noise. After solving equation 4 for the output signal, the frequency domain analysis may be shown by:

$$Y = \frac{X}{(f+1)} + N_q \frac{f}{(f+1)} \qquad (5)$$

Examining equation 5 across the frequency spectrum generally confirms the theoretical noise shaping characteristic of the delta-sigma modulator. At 0 frequency, f=0 Hz, the output signal, Y, generally comprises the input signal X. As the frequency is increased, Y typically begins to include a greater amount of the quantization noise, Nq. Finally, at infinite frequency, f=∞, the output signal, Y, may comprise only the quantization noise, Nq. Therefore, at low frequencies, the quantization noise is generally suppressed with the delta-sigma modulator typically pushing the noise energy to higher frequency levels. Because the laws of physics require that energy must be conserved, the noise energy generally remains the same in total, with only its density being shifted or shaped to the higher frequencies, which are typically outside the frequency band of interest.

FIGS. 3 and 4 graphically show the effect of the delta-sigma modulator's noise shaping characteristics. FIG. 3 illustrates the general frequency domain representation of a modulator's response without noise shaping. With the assumption that the quantization noise may be typically represented as white noise, the frequency spectrum of the quantization noise is generally shown as a constant value across the entire frequency range. Without noise shaping, there is usually a large component of quantization noise interfering with the modulator's signal spectrum. FIG. 4 shows the expected theoretical results of the noise shaping characteristics of the delta-sigma modulator. At the lower frequencies, which include the entire frequency band of interest, the quantization noise has generally been suppressed by the high pass signal filtering effect of the delta-sigma modulator. However, the energy of that suppressed noise has typically been shifted or shaped to the higher frequencies. The result is a frequency band of interest which may have much of its noise filtered away.

Similar to other filter applications, higher-order delta-sigma modulators will typically produce better noise shaping qualities. Second, third, and fourth order delta-sigma modulators are generally common in the art and each exhibits progressively better noise shaping and noise response. The improved response can typically be represented mathematically by the formula:

$$S(f) = \left[2\sin\left(\frac{\pi f}{f_r}\right)\right]^n \qquad (6)$$

Where S(f) represents the frequency response of the delta-sigma modulator quantization noise, f, is the frequency variable, and $f_s$ is the sampling frequency. However, because general higher-order modulators usually require high-order feedback loops, instability has typically been seen in some high-order delta-sigma modulators.

One solution typically used to implement high-order delta-sigma modulators is the Multi-Stage Noise Shaping (MASH) architecture. Instead of unstable, high-order feedback loops, MASH architecture cascades multiple first-, second-, or a combination of first- and second-order delta-sigma modulators which feed the quantization error forward to the next cascaded level. In this configuration, as the output of each modulator is processed through differentiators and added to form the resulting modulated output, the quantization error signals of each preceding stage cancel out leaving only the quantization error value of the last delta-sigma modulator stage shaped by a high-order high pass filter. Because there are no high-order feedback loops, the MASH architecture has generally proven to be quite stable for multi-stage delta-sigma modulators. Therefore, the generally improved overall response of higher-order delta-sigma modulators can be reliably achieved.

FIG. 5 shows a linearized, hybrid, Z-Transform model of a MASH fourth-order delta-sigma modulator. Each stage of delta-sigma modulator typically comprises summer 50, quantizer 51, summer 52, which usually subtracts the intermediate digitized signal, and delay 53, represented in Z-Transform notation. The second through fourth stages also generally include a number of digital differentiators 54, represented in Z-Transform notation, corresponding to the stage level minus one. Therefore, stage two modulator 520 typically contains one digital differentiator 54 (i.e., 2−1=1), while stage four modulator 540 typically contains three digital differentiators 54 (i.e., 4−1=3). These cascaded digital differentiators usually shape the quantization noise of each stage prior to the final summing in summer 500. The noise canceling characteristics of the MASH architecture can generally be observed through mathematically processing a theoretical signal through delta-sigma modulator system 5. The digitized output signal of delta-sigma modulator system 5 typically comes from summer 500. The intermediate digitized output signals from each of the delta-sigma modulator stages are generally added together at summer 500 to form the final modulated output signal. From stage one modulator 510, stage one digitized signal A1 may be mathematically represented by the following formula:

$$A1 = N(z) + Q1(z)(1-Z^{-1}) \quad (7)$$

Similarly, including the digital differentiators 54 in the later stages, stage two digitized signal A2 through stage four digitized signal A4 may typically be represented by the following formulae:

$$A2 = [-Q1(z) + Q2(z)(1-Z^{-1})](1-Z^{-1}) = -Q1(z)(1-Z^{-1}) + Q2(z)(1-Z^{-1})^2 \quad (8)$$

$$A3 = [-Q2(z)(1-Z^{-1}) + Q3(z)(1-Z^{-1})](1-Z^{-1})^2 = -Q2(z)(1-Z^{-1})^2 + Q3(z)(1-Z^{-1})^3 \quad (9)$$

$$A4 = [-Q3(z)(1-Z^{-1}) + Q4(z)(1-Z^{-1}](1-Z^{-1})^3 = -Q3(z)(1-Z^{-1})^3 + Q4(z)(1-Z^{-1})^4 \quad (10)$$

Note that each stages quantization noise component, $Qn(z)$, is passed to the subsequent stages as $-Qn(z)$ by virtue of passing through the summers 52. Therefore, by adding the four intermediate digitized signals A1 through A4 at summer 500, the quantization noise terms of the first through third stages cancel out leaving delta-sigma modulator system 5's final output generally represented by the formula:

$$Output = N(z) + Q4(z)(1-Z^{-1})^4 \quad (11)$$

Equation 11 illustrates that the quantization noise of the last state, $Q4(z)$, is shaped by a fourth order high pass filter.

As suggested previously, in the analysis and design of delta-sigma modulators, an assumption is made that the quantization noise injected by the low-bit quantizer corresponds to white noise. In fact, this assumption is almost never true. In signal processing applications, which deal primarily with dynamic signals having either large amplitude or random, small amplitudes, the "busy-ness" of those signals may typically allow the quantization noise to approximate white noise. Therefore, in such instances, the white noise assumption may not lead to extensive unexpected spurious signals in the output. However, delta-sigma modulation of DC, periodic, or some manner of steady-state signals, many of which are regularly found in audio, speech, or frequency synthesizing applications, will generally not produce the good noise shaping and suppression predicted using the white noise assumption. One example of such signals in an audio context is the idle tones or periods of silence in audio signals. These idle signals represent DC, periodic, or, at a minimum, steady-state levels which may cause high noise levels or spurs to be injected into the baseband spectrum.

When such digital, steady-state, or periodic signals are modulated, correlations begin to form between the quantization noise and the input signal because of the periodic nature of the signals. As the input signal and noise begin forming correlations, it becomes increasingly difficult to separate the signal from the noise as the signal is processed. As a result, the correlations produce discrete spurious components in the output and reduce the modulator's overall effective noise suppression and dynamic range. To counteract this effect, the industry typically uses three different techniques: dithering, wider word length (in digital circuits), or higher order delta-sigma modulators.

Because the increased spurious signal content arises due to the correlations formed between the input signal and the quantization noise, dithering typically counteracts the correlation by essentially adding noise to the system at some point. The result of the added noise makes the quantization noise appear more white, which increases the effectiveness of the white noise assumption, by generally decreasing the correlations formed between the two signals. To implement dithering in a delta-sigma modulator, components must be added to the circuit which inject noise into the system. In an analog application, a noisy resistor or amplifier may generally be used to inject noise. In a digital application, a pseudo-random number generator may typically be added, which injects random "noise" signals into the system. Therefore, to implement dithering, the circuit size, complexity, and power requirement of the delta-sigma modulator must increase.

Another technique generally used in digital applications is to increase the word size of the digital modulator. By increasing the word length, the resolution typically becomes finer; that is, becomes smaller. As the resolution becomes smaller, the effective result generally pushes all of the spurious signal energy closer together. Spurious signal components typically arise at each multiple or harmonic of the resolution frequency, which is usually the sampling frequency divided by $2^{wordlength}$. Therefore, as the resolution becomes smaller, there will typically be more spurious signals over a given frequency range. This increase in spurious signal components generally begins to appear or act like white noise, thus effectively decorrelating the input signal from the quantization noise.

To implement an increased word size in a digital application, the components of the modulator must typically be redesigned. For instance, if a digital modulator begins with a 12-bit word length utilizing a 12-bit latch and 12-bit adders, increasing the word size to 20-bits would generally require substituting a 20-bit latch and 20-bit adders. This small change actually results in a very large increase in circuitry to accommodate the larger word length. Thus, implementing the increased word length also requires an increased circuit size and complexity.

The third technique, using a higher-ordered delta-sigma modulator, generally takes advantage of the inherent increase in noise shaping at the higher orders, as given in equation 6, to suppress the increased spurious signals due to the correlations between the input signal and the quantization noise. Also, the use of higher-order delta-sigma modulators has been shown to reduce the amount of correlation between the input and the quantization noise. As the technique suggests, using a higher-ordered delta-sigma modulator generally requires, at a minimum, the number of additional components required for a first-order modulator, for each additional order desired. Therefore, as with each of the preceding methods, using a higher-ordered delta-sigma modulator typically requires an increased circuit size and complexity.

One of the practical consequences of designing higher order delta-sigma modulators is that the quantization noise shaped to higher frequencies may reach very large signal powers because of the high order high pass noise shaping applied to the quantization noise. In theoretical design, the use of higher order delta-sigma modulation decorrelates its quantization noise with the input. However, in practice, circuit design problems arise due to the large signal power that peaks at $f_s/2$. One such problem is that the $f_s$ clock signal can couple into sensitive bias circuits that power the signal path components thereby causing high-powered, out-of-band tones to demodulate down to baseband and severely degrade the SNR and spurious free dynamic range of the delta-sigma modulator.

Another commonly found problem in practical circuits is that components in a system using a delta-sigma modulator may cause the same above-described effect due to the second order intermodulation performance of these components. For example, if there are two high powered tones at 990 kHz and 995 kHz, a spur will appear at 5 kHz due to second order nonlinearity of a component. This component could be an amplifier in an audio application or a phase-frequency detector in a delta-sigma modulator-based fractional-N frequency synthesizer.

The problem with each of the preceding noise reduction techniques arises from the necessity to use additional components and circuitry. Delta-sigma modulators may typically be fabricated on a single integrated circuit substrate. Furthermore, an application specific integrated circuit could include a number of normally discrete components on the same integrated circuit substrate. Therefore, a delta-sigma modulator may share the same substrate area with other components such as an amplifier or a phase locked loop. Two generally valued and conserved resources on integrated circuits are area and power. Each of the three preceding noise reduction techniques requires the use of additional components. Adding components typically means using more space or area on an integrated circuit substrate, as well as requiring more current to drive them. The increased current requirement generally equates to a higher power requirement. Thus, the three noise reduction techniques currently used to enhance the performance of delta-sigma modulators each achieves its increased noise performance at the expense of the limited area and power for any given integrated circuit.

SUMMARY OF THE INVENTION

In consideration of the problems inherent in the current state of the art, it would be advantageous to have a multiple-order sigma-delta modulator which achieves improved noise suppression and noise shaping without unnecessarily increasing the size, complexity, or power requirements of the circuit.

These and other features and technical advantages are achieved by a system and method for a second- or greater-order delta-sigma modulator in which the quantizer in the second and/or subsequent delta-sigma modulator stages, are preferably selectively programmed to vary the reference signal by a predetermined amount. The resulting signal exhibits the enhanced noise suppressing and noise shaping characteristics of a dithered delta-sigma modulator without the added circuitry, complexity, or power requirements.

In operation, a second- or higher-order delta-sigma modulator using a preferred embodiment of the present invention would typically receive a signal for modulation. This signal generally passes through the initial summer to be combined with the output of a quantizer in the feedback loop. The input signal is then typically integrated by an integrating circuit component. After integration, the new signal is preferably quantized by the quantizer into discrete levels limited by a predetermined reference signal. The quantizer will then usually pass the quantized signal to the output summer and to the feedback loop.

If the delta-sigma modulator has been designed using the MASH architecture, the first stage quantization error signal, which comprises the quantized output subtracted from the integrated input signal, is typically fed forward into the second stage modulator. The output is then fed back to the initial summer of stage one for combining with the input signal. In the second stage, the first stage quantization error signal generally passes through the second stage summer to be added to the output of the second stage quantizer. This signal is typically integrated by an integrating circuit component. The integrated signal is then preferably quantized by the second stage quantizer. According to a preferred embodiment of the present invention, the second stage quantizer will have preferably been preprogrammed to a different reference signal level than the first stage quantizer. In MASH delta-sigma modulators digital differentiators are added into the signal path between the quantizer and the output summer for the second and higher stages. These digital differentiators typically shape the noise in the stage's output prior to the final summing. After shaping in the digital differentiators, the digitized signal output of the second stage quantizer is then preferably passed to the output summer to be added with the output signal of the first stage to form the final modulated output.

In MASH delta-sigma modulators over second-order, the second stage quantization error signal, which comprises the second stage output subtracted from the integrated second stage input signal, would generally be fed forward to the subsequent stage, in which each subsequent stage may preferably contain an quantizer preprogrammed to a reference signal different from that of the first stage. Depending on the particular configuration of the present invention, some reference signals may be equal to the first stage reference signal, while some would be different. In a preferred embodiment of the present invention, the varied reference signals would only be offset by one LSB. Each stage's quantization error signal would then generally be fed forward to the next stage for processing. As with the second-order modulators, in MASH implementations of higher-ordered delta-sigma modulators, digital differentiators shape the quantization noise of each stage's output signal but the first stage output signal, which is not shaped by digital differentiators. These shaped, digital signals are then passed to the output summer After each stage's signal is added together at the output summer, the resulting modulated output exhibits the enhanced noise suppression and noise shaping characteristics of a dithered delta-sigma modulator, without requiring the additional components, circuit area, and power of prior art systems.

The effect of varying the subsequent stages' reference signals generally "whitens" the quantization noise present in the system. Spurious signal components typically arise due to correlations formed between the quantization noise and the input signal. The correlations form because the signal path waveforms generally begin to look periodic. By varying the reference signals, the period of the signal path waveform is usually increased. As the period increases, the signal waveforms will typically begin to appear less periodic when sampled or viewed across the same frequency range. This lengthening of the period, then generally results in "whitened" quantization noise, which improves the performance of the delta-sigma modulator.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

A preferred embodiment of the present invention enhances the noise characteristics of multi-order delta-sigma modulators by preferably including a quantizer in every modulator stage after the first, which may be selectively programmed to vary the reference signal associated therewith. To achieve the improved response, the preferred embodiment of the present invention would vary the subsequent stages' reference signals to be different from the first stage reference signal.

Figure 1A:
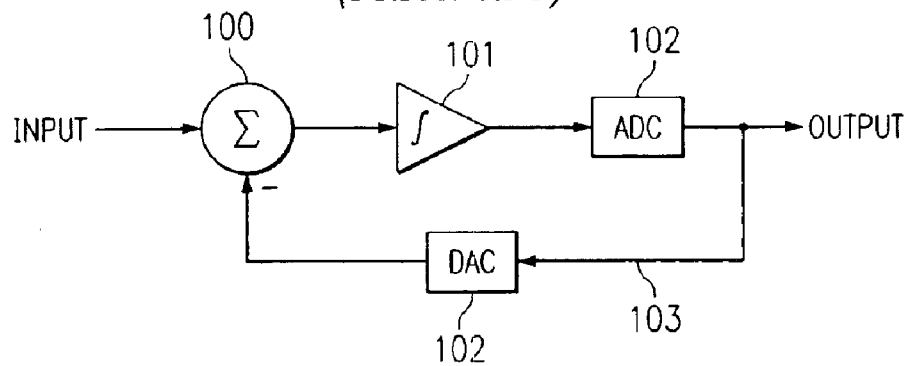
FIG. 1A is a block diagram showing a prior art analog domain first-order delta-sigma modulator.
Figure 1B:
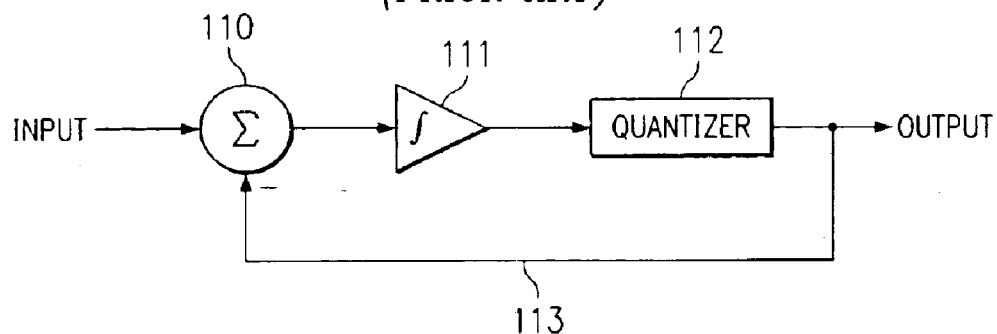
FIG. 1B is a block diagram showing a prior art digital domain first-order delta-sigma modulator.
Figure 2:
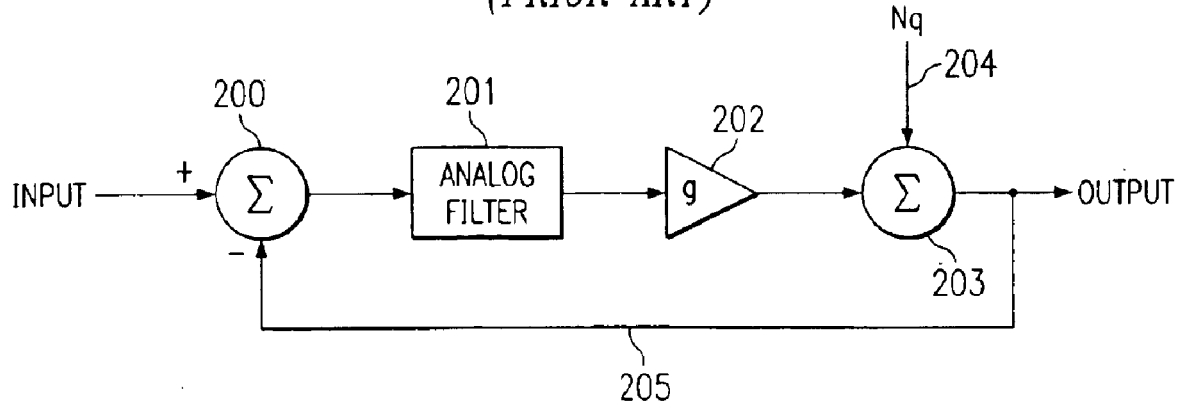
FIG. 2 is a frequency domain, linearized model of a prior art first-order delta-sigma modulator.
Figure 3:
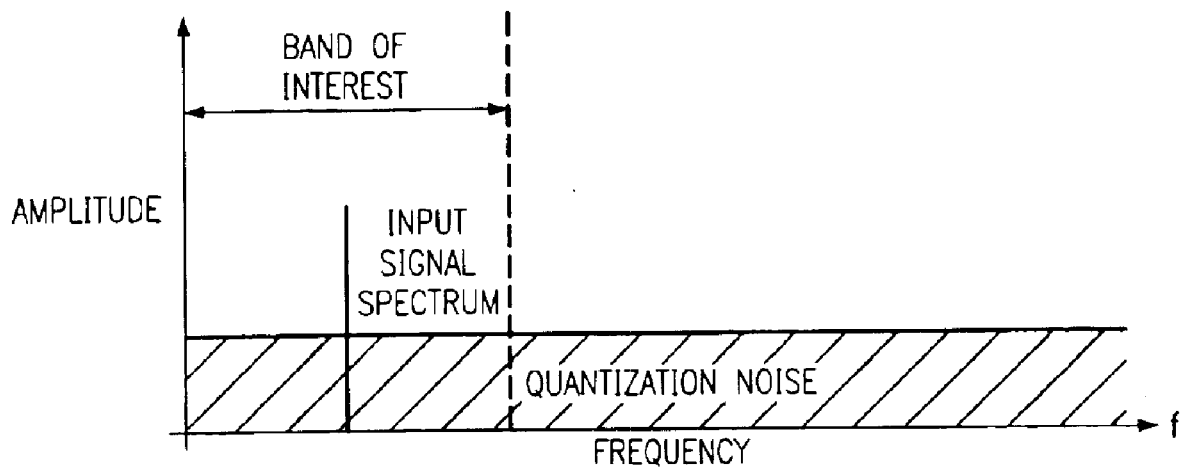
FIG. 3 is a graph showing a hypothetical frequency response spectrum of a signal modulated without noise shaping.
Figure 4:
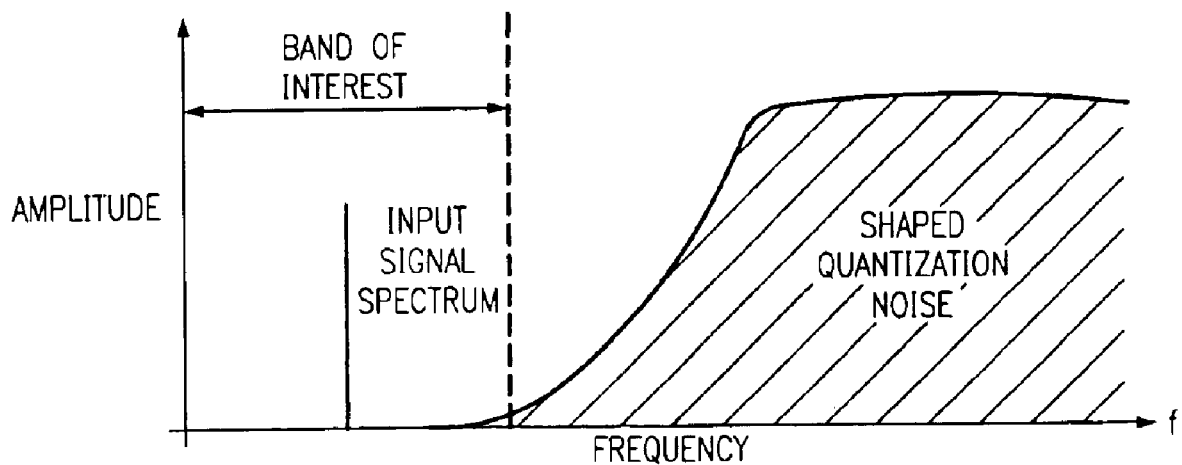
FIG. 4 is a graph showing a hypothetical frequency response spectrum of a signal modulated with noise shaping.
Figure 5:
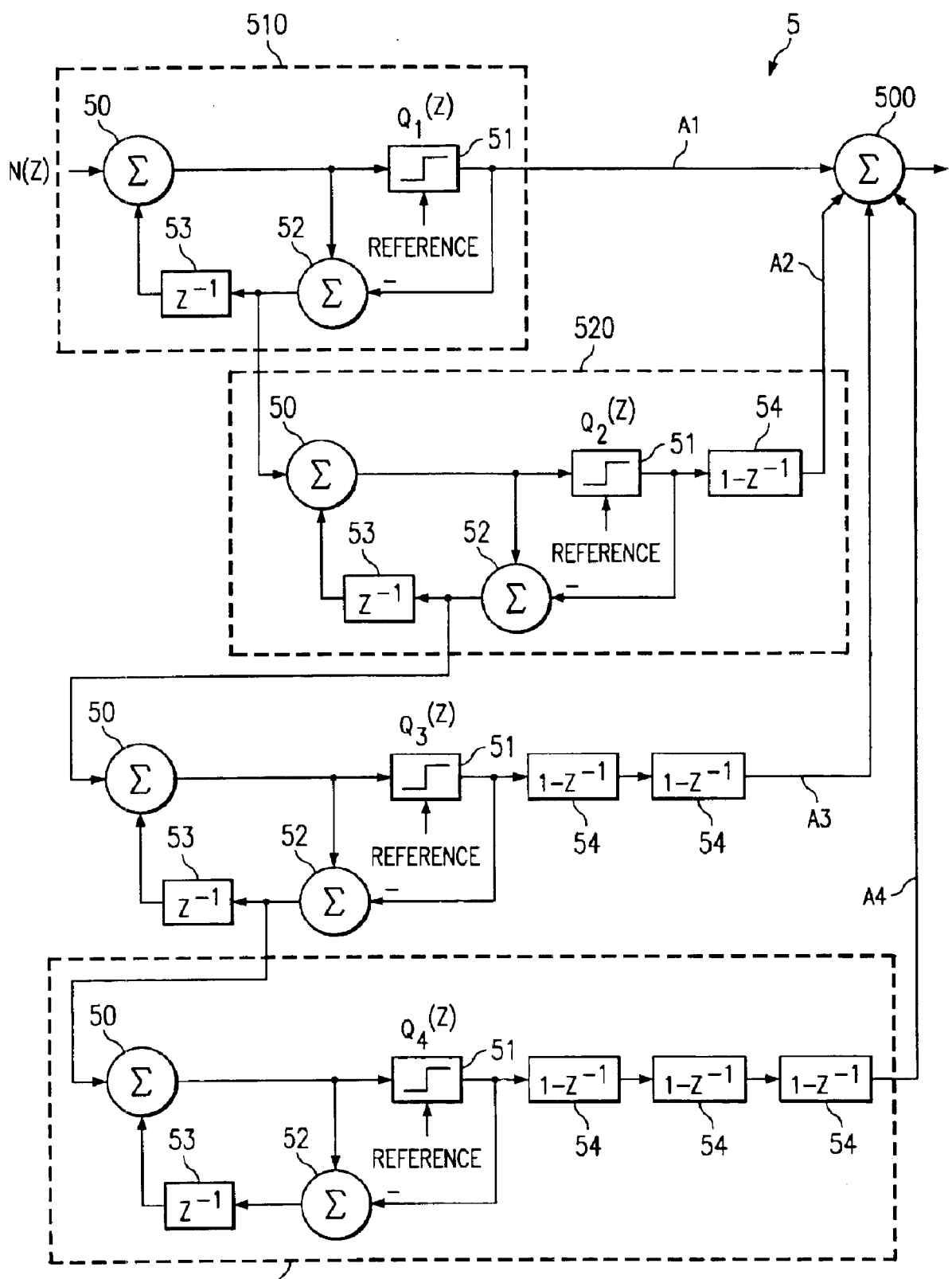
FIG. 5 is a hybrid block diagram showing a prior art MASH fourth-order delta-sigma modulator using descriptive blocks and Z-Transform representation blocks.
Figure 6:
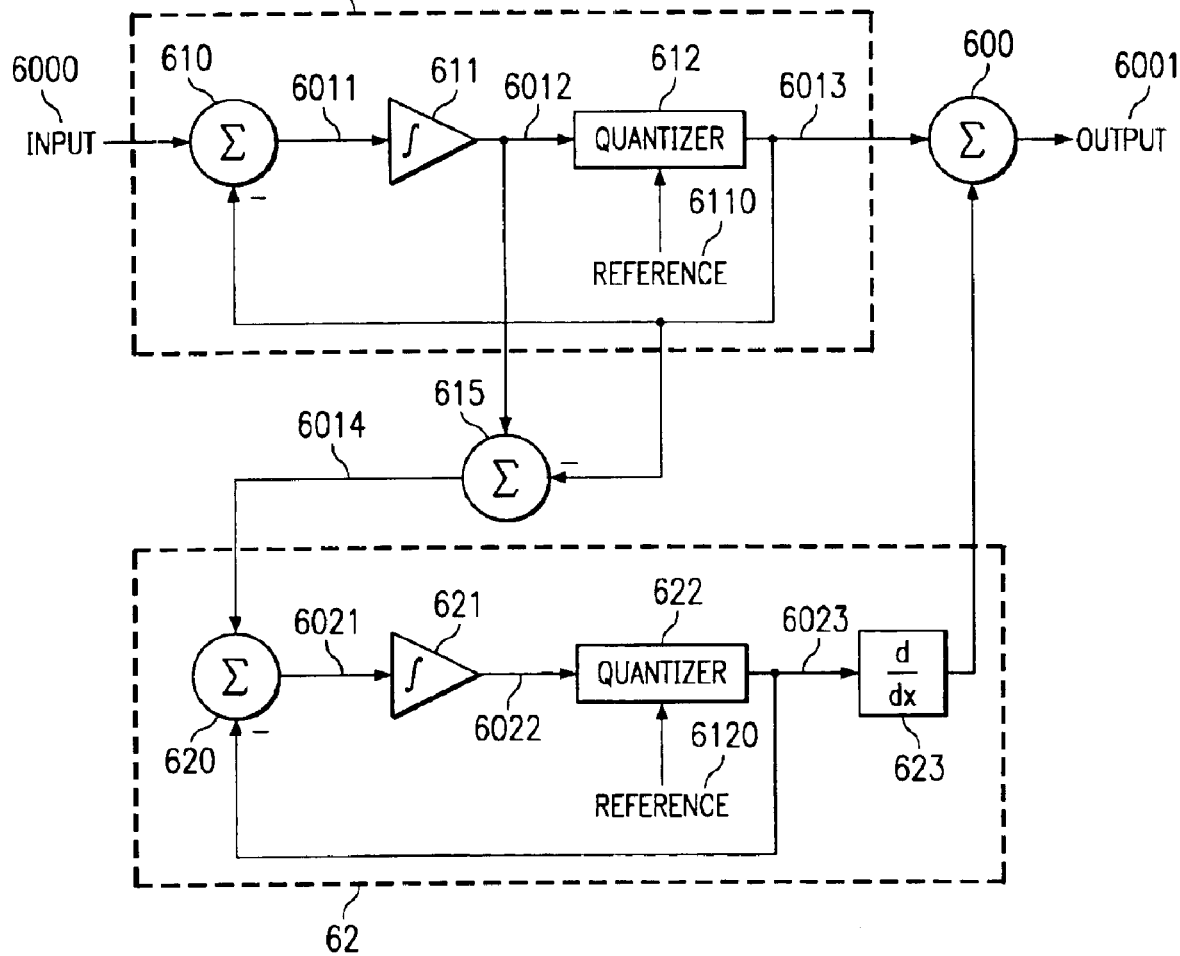
FIG. 6 is a hybrid block diagram showing a preferred embodiment of the present invention configured as a MASH second-order digital domain delta-sigma modulator using descriptive blocks.

FIG. 6 shows a preferred embodiment of the present invention configured as a digital MASH second-order delta-sigma modulator. The inventive system generally receives input signal 6000 into stage one modulator 61. Input signal 6000 typically passes through stage one summer 610 which subtracts stage one output signal 6013 to form stage one intermediate signal 6011. Stage one intermediate signal 6011 is then usually integrated by integrator 611 to form stage one integrated signal 6012, which is then typically quantized by quantizer 612 using reference signal 6110. Quantizer 612 then usually outputs stage one output signal 6013 to output summer 600. Stage one output signal 6013 also typically feeds back to stage one summer 610 for subtracting from input signal 6000 to form stage one intermediate signal 6011.

Because of its MASH configuration, the negative of stage one output signal 6013 is also usually fed to summer 615 to be subtracted from integrated signal 6012. The resulting stage one quantization error signal is then typically fed forward into stage two modulator 62. In the second stage, this stage one quantization error signal 6014 typically passes through stage two summer 620 wherein stage two output signal 6023 is subtracted. The resulting stage two intermediate signal 6021 is then integrated by integrator 621 to form stage two integrated signal 6022, which is then quantized by quantizer 622 preferably using reference signal 6120. According to the preferred embodiment of the present invention, reference signal 6120 preferably differs from reference signal 6110 by one least significant bit (LSB). Quantizer 622 usually outputs stage two output signal 6023 to the output summer 600 to be added to stage one output signal 6013 to form modulated output signal 6001. A digital differentiator 623 is placed between quantizer 622 and output summer 600 which shapes the noise within stage two output signal 6023 prior to the final summing. Stage two output signal 6023 is also generally fed back to stage two summer 620 to form into stage two intermediate signal 6021. Stage two output signal 6023 will then usually be summed with stage one quantization error signal 6014 at stage two summer 620.

Figure 7:
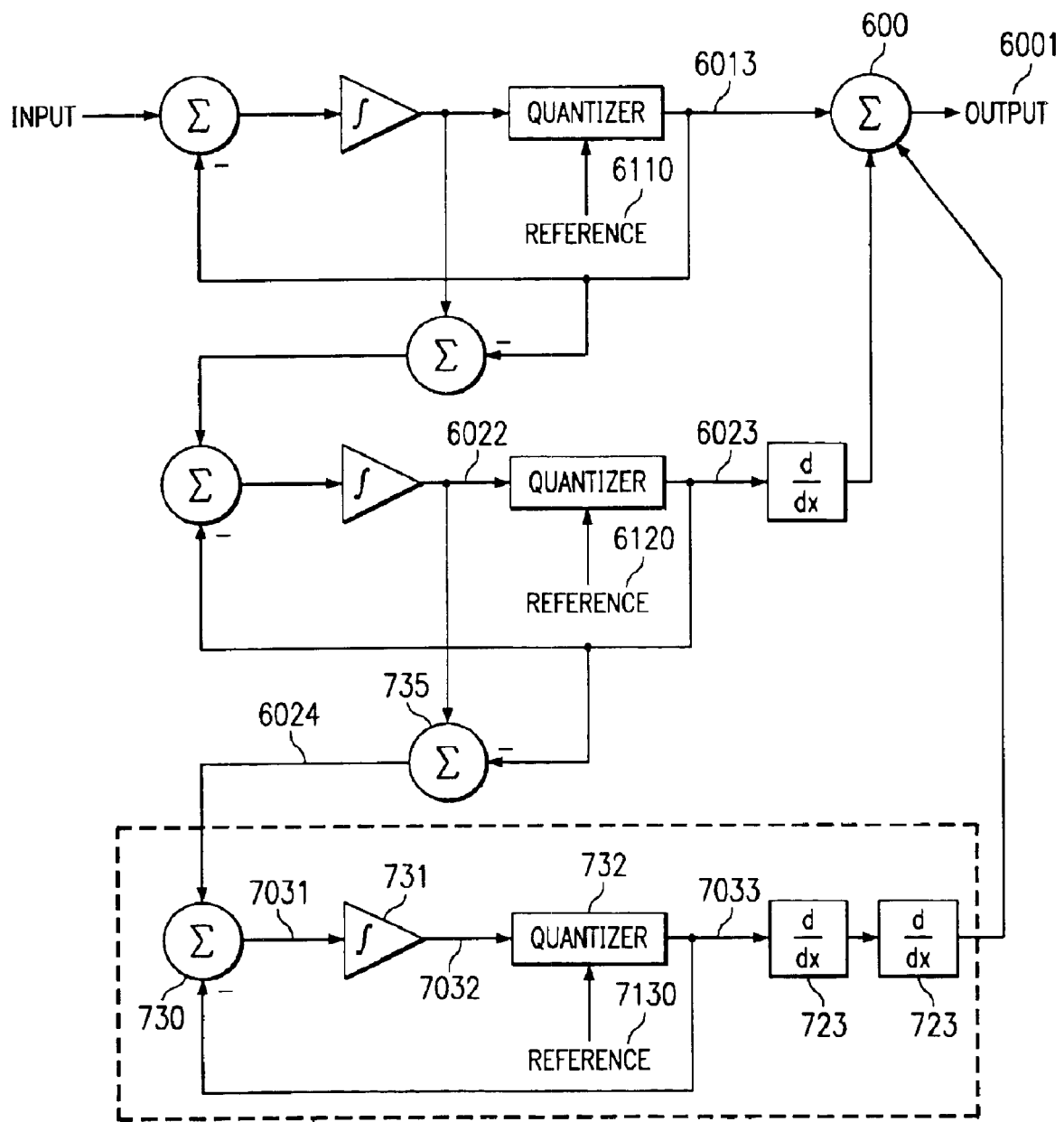
FIG. 7 is a hybrid block diagram showing a preferred embodiment of the present invention configured as a MASH third-order digital domain delta-sigma modulator using descriptive blocks and Z-Transform representation blocks.

FIG. 7 shows an alternative preferred embodiment of the present invention configured as a digital MASH third-order delta-sigma modulator. The first two stages operate identically to the previously described second-order embodiment. The difference arises when stage two quantization error signal 6024, which is formed by subtracting stage two output signal 6023 from integrated signal 6022 at summer 735, is fed forward into stage three modulator 73. In the third stage, the stage two quantization error signal 6024 typically passes through stage three summer 730 wherein stage three output signal 7033 is generally subtracted. The resulting stage three intermediate signal 7031 is then typically integrated by integrator 731 to form stage three integrated signal 7032, which is then quantized by quantizer 732 preferably using reference signal 7130. According to a preferred embodiment of the present invention, reference signal 7130 is the same as reference signal 6120 but different from reference signal 6110. Quantizer 732 preferably outputs stage three output signal 7033 to the output summer 600 to be added to stage one output signal 6013 and stage two output signal 6023 to form modulated output signal 6001. Two digital differentiators 723 are placed between quantizer 722 and output summer 600 which shape the noise within stage three output signal 7033 prior to the final summing.

In digital MASH-configured multi-stage delta-sigma modulators, a specific number of digital differentiators are required to achieve the inherent noise cancellation. In general, the appropriate number is determined by the particular stage of the modulator minus one. Therefore, Stage two included only one digital differentiator, 623, (2−1=1) while Stage three includes two, 723, (3−1=2).

Figure 8:
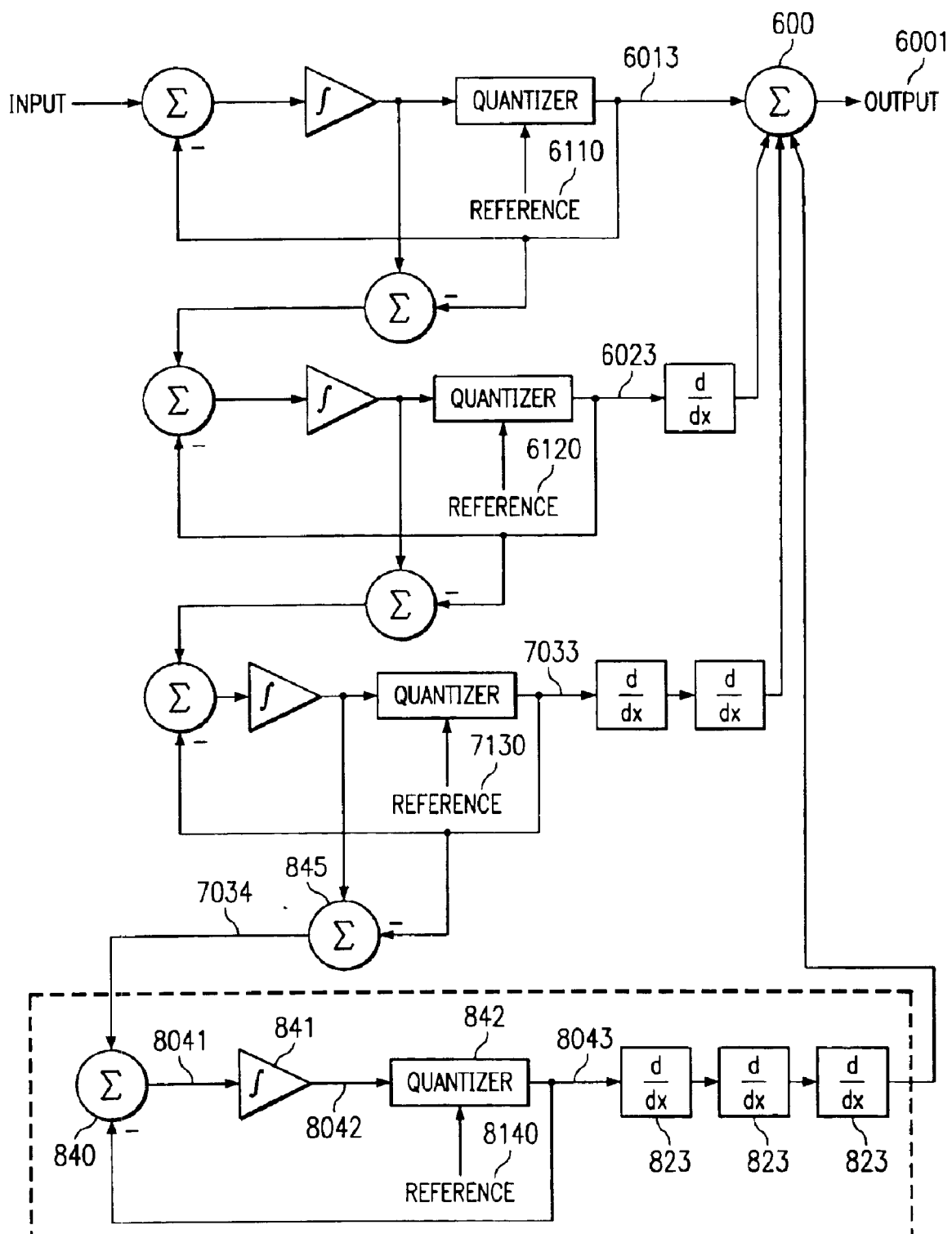
FIG. 8 is a hybrid block diagram showing a preferred embodiment of the present invention configured as a MASH fourth-order digital domain delta-sigma modulator using descriptive blocks and Z-Transform representation blocks.

FIG. 8 shows a further alternative preferred embodiment of the present invention configured as a digital MASH fourth-order delta-sigma modulator. The first three stages operate identically to the previously described third-order embodiment. However, according to a preferred embodiment of the present invention, stages one and two reference signals, 6110 and 6120 are the same. Further difference arises as stage three quantization error signal 7034, formed by subtracting stage three output signal 7033 from integrated signal 7032 at summer 845, is fed forward into stage four modulator 84. In the fourth stage, stage three quantization error signal 7034 typically passes through stage four summer 840 wherein stage four output signal 8043 is subtracted. The resulting stage four intermediate signal 8041 is then typically integrated by integrator 841 to form stage four integrated signal 8042, which is then quantized by quantizer 842 preferably using reference signal 8140. According to this preferred alternative embodiment of the present invention, reference signals 7130 and 8140 are preferably equal to each other, but differ from reference signals 6110 and 6120 by one. Quantizer 842 preferably outputs stage four output signal 8043 to the output summer 600 to be added to stage one output signal 6013, stage two output signal 6023, and stage three output signal 7033 to form modulated output signal 6001. Three digital differentiators 823 (4−1=3) are placed between quantizer 842 and output summer 600 which shape the noise within stage four output signal 8043 prior to the final summing. Stage four output signal 8043 is also typically fed back to stage four summer 840 to form stage four intermediate signal 8041.

The alternative preferred embodiments of the third- and fourth-order delta-sigma modulators of the present invention described above show alternate sequences for varying the later stage reference signals. In the third-order modulator of FIG. 7, both the subsequent reference signals are the same yet different from the initial reference signal. In the fourth-order modulator of FIG. 8, the third and fourth stages' reference signals are equal to each other, but different from the first and second stages' reference signals. It should be noted that in further alternative embodiments, other combinations of varied subsequent reference signals may be used. For example, in an alternate preferred embodiment of the present invention configured as a digital MASH fourth-order delta-sigma modulator, as shown in FIG. 8, the second, third, and fourth stages' reference signals are equal to each other, but different from the first stage reference signal. In an alternative example, the second, third, and fourth stages' reference signals could each be different from each other, as well as different from the first stage reference signal. As such, any combination or sequence may be used within the scope of the present invention as long as, at least, one of the subsequent stage reference signals is different from the initial stage reference signal.

It should be noted that in an analog embodiment of the present invention, digital-to-analog converters (DACs) would be placed in the feed-back loop of each modulator level. For example, in FIG. 6, the feed-back output from quantizer 622 would pass through a DAC to form an analog signal representing the output. This analog output signal would then go to stage two summer 620 to form intermediate signal 6021.

Spurious signal components inherently arise in the output signal due to correlations typically formed between the quantization noise and the input signal for DC, steady-state, or many audio signals. The correlations generally form because the signals in the delta-sigma modulator begin to look periodic. By varying the reference signals within the subsequent modulator stages, the period of the output signal is usually increased. As the period increases, the signal will preferably begin to appear less periodic when sampled or viewed across the same frequency range. This lengthening of the period, then, results in a beneficial "whitened" noise, which improves the performance of the delta-sigma modulator.

With reference to the noise canceling characteristics of the MASH architecture, as developed in equations 7 through 11, the preferred variation of later-stage reference signals effectively reduces the level of quantization noise cancellation inherent in the MASH architecture. This may, in fact, increase in-band noise slightly, but greatly reduces out-of-band noise power, which was described to degrade delta-sigma modulator performance, especially in higher-order modulators. The amount of change or offset between the initial reference signal and the subsequent reference signals must, therefore, preferably be balanced against the diminished close-in noise cancellation it induces. In determining the size of the reference signal, which is also referred to as the resolution, and the size of the offset, several competing factors must typically be considered. The resolution of the reference signal has a direct relationship to the amount of spectral leakage usually found in the output signal. Spectral leakage is generally the percentage of quantization noise in the first modulator stages (i.e., all except for the final stage) which is not canceled due to the reference signal offset. Increasing the reference signal resolution generally results in a decrease of spectral leakage. Spectral leakage is also preferably optimized when the size of the offset in reference signals is small. Because the spectral leakage is increased, at least in part, by the offset of the reference signal, minimizing the offset preferably minimizes the amount of spectral leakage to the output signal.

A third factor to consider when balancing the reference signal offset against the spectral leakage is the stage at which to begin placing the reference signal offsets. Experimentation has shown the optimum stages to offset the reference signals are after the first modulator stage.

These relationships are generally validated through the analysis of a specified spurious signal component (spur) at a given frequency. The amount of spectral leakage at a given frequency is essentially equivalent to the amplitude of the spur at that frequency. Assuming a given frequency, $f_c$, the amplitude of the spur at $f_c$ is generally equal to the value of the spur at $f_c$ for a generic MASH delta-sigma modulator, of an order equal to the stage number just prior to the stage in which the offset is first inserted. The amplitude of the spur is then this generic value subtracted by a spur reduction factor. The spur reduction factor is calculated by the formula:

$$\text{spur reduction factor} = 20 * \log\left(\frac{\Delta f_r}{f_{r1}}\right) \text{(in dB)} \tag{12}$$

Where $\Delta X_r$ represents the reference signal offset and $X_{r1}$ represents the first stage reference signal. To verify the relationships noted above, simulations were run using two fourth-ordered MASH delta-sigma modulators. The first modulator, MASH A, was configured with a first reference signal of 210 and the second through fourth reference signals of 211. The second modulator, MASH B, was configured with the first and second reference signals of 210 and the third and fourth reference signals of 211. MASH A and B were both simulated using inputs of 2 with a clock frequency of 5.25 MHz. The analysis centered on the spur at 50 kHz.

For this simulation, the spur reduction factor equals approximately −46.4 dB. The value for the 50 kHz spur in MASH A is calculated as the value of the 50 kHz spur for a generic first-order MASH delta-sigma modulator minus 46.4 dB. A generic first-ordered MASH is used because the reference signal offset in MASH A begins in the second stage of the modulator. Using an experimentally obtained value of 6.0 dBc for a generic first-order modulator, the value of the 50 kHz spur for MASH A is approximately −40.5 dBc.

The value for the 50 kHz spur in MASH B is similarly calculated as the value of the 50 kHz spur for a generic second-order MASH delta-sigma modulator minus 46.4 dB. A generic second-ordered MASH is used because the reference signal offset in MASH B begins in the third stage of the modulator. Using an experimentally obtained value of −30.1 dBc, for a generic second-order modulator, the value of the 50 kHz spur for MASH B is approximately −76.2 dBc.

By examining the relationships within equation 11, the performance trade-offs between the reference signal resolution and offset are generally realized. If the offset is generically increased by a factor of two, then the spur would typically show an increase of approximately 6 dB. However, if, instead, the resolution of the reference signal is increased by a factor of two, then the spur decreases by approximately 6 dB. This relationship shows that an offset of one LSB is typically the preferred value, while the reference signal resolution should preferably be high enough to keep the spectral leakage from violating any design specification.

Simulation has also shown that, for optimum performance, at least two stages with offset reference signals should preferably be included in a preferred embodiment of the present invention. Therefore, to achieve the largest beneficial result from the present invention, at least two of the last stages of the inventive delta-sigma modulator should preferably include offset reference signals.

In another experimental example of a preferred embodiment of the present invention, the reference signal offset of one is preferably made to the third and fourth stage reference signals. For example, referring to FIG. 8, showing a digital MASH fourth-order delta-sigma modulator using a preferred embodiment of the present invention, reference signals 6110 and 6120 may be programmed to 1,050 while reference signals 7130 and 8140 may be programmed to 1,051. As shown in the following simulation, this small variation of subsequent stage reference signals produces an acceptable trade-off between MASH noise cancellation and enhanced noise suppression and shaping exhibited by the present invention.

The decrease in noise cancellation generally causes some of the early-stage quantization noise to leak through to the output. This was previously referred to as spectral leakage and is shown as labeled in FIG. 10. It is also typically known as close-in noise. Therefore, decreasing the cancellation properties, generally increases the close-in noise exhibited by a preferred embodiment of the present invention. However, as presented below in the simulation of a preferred embodiment, the peak noise performance, where "peak noise" is the peak of the noise transfer function generally occurring around the Nyquist rate, preferably exhibits a more beneficial improvement. In many typical applications, the resulting increased peak noise performance preferably outweighs the detrimental effects caused by the increased close-in noise. By reducing the peak noise, the potential for second-order mixing products mixing down into the band of interest also decreases. These cross-modulation products typically degrade the delta-sigma modulator's spurious free dynamic range. This is generally of increased importance in audio circuits or frequency synthesizing applications.

Figure 9:
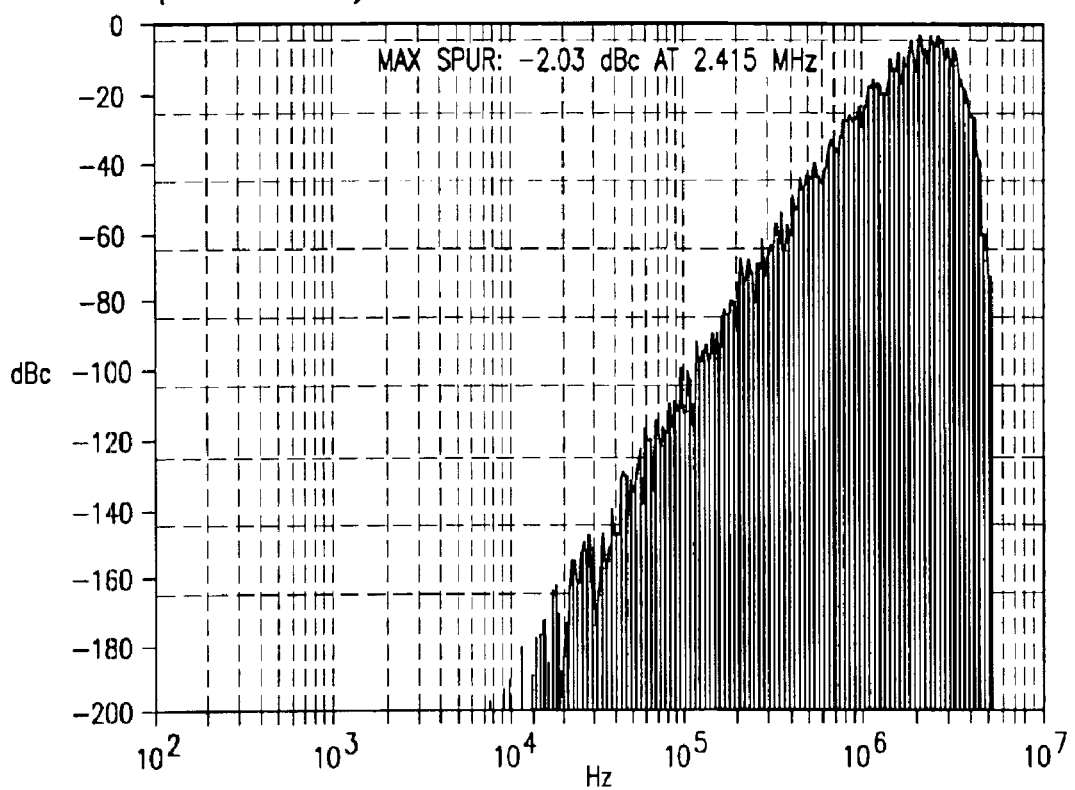
FIG. 9 is a graph showing the frequency spectra of a simulated carry output from a prior art fourth-order delta-sigma modulator.
Figure 10:
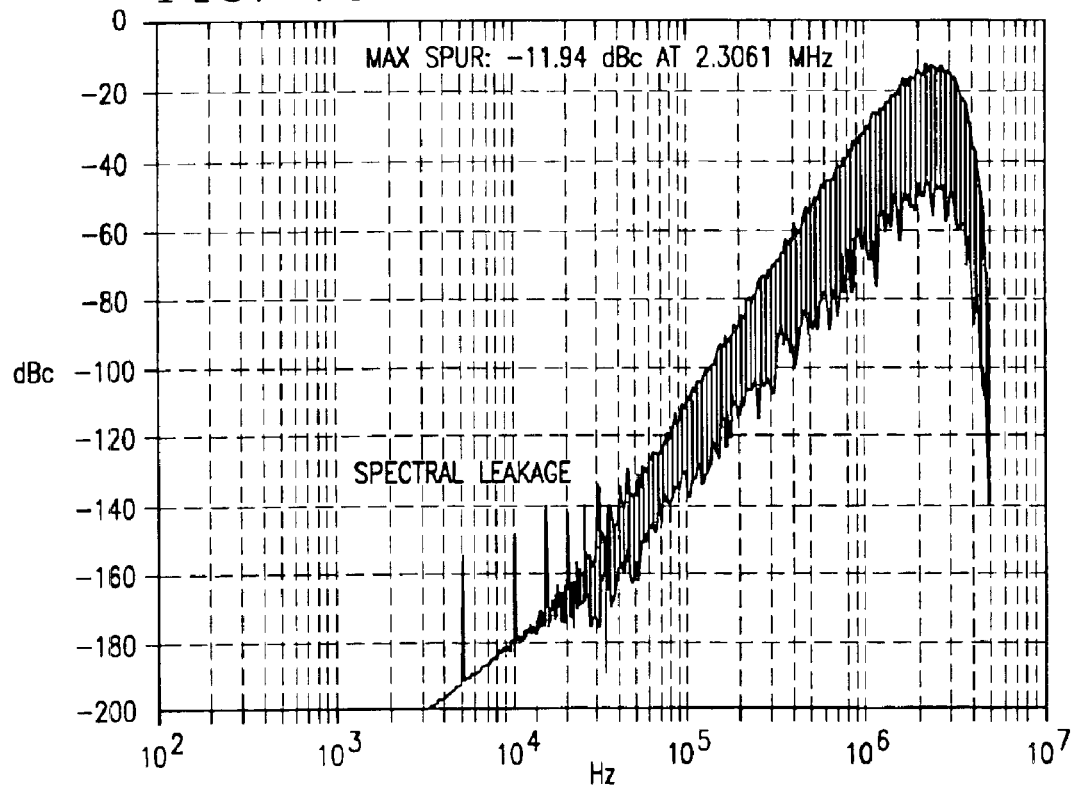
FIG. 10 is a graph showing the frequency spectra of a simulated carry output from a fourth-order delta-sigma modulator using a preferred embodiment of the present invention.

FIG. 9 shows the frequency response of a digital MASH fourth-order delta-sigma modulator of the prior art with each reference signal set to 1,050. FIG. 10 shows the frequency response of a digital MASH fourth-order delta-sigma modulator using a preferred embodiment of the present invention in which the first and second stage reference signals are set to 1,050 while the third and fourth reference signals are set to 1,051. The delta-sigma modulators of FIGS. 9 and 10 may be incorporated into any appropriate application such as a fractional-N, Phase-Locked Loop (PLL) frequency synthesizer, which is a typical use of delta-sigma modulators to improve phase noise performance and allow for wider loop bandwidths to improve lock time. Both FIGS. 9 and 10 would represent the frequency response of the delta-sigma modulator output, which would be used as the fractionalized portion in frequency divider 1104 of FIG. 11. In both FIGS. 9 and 10, the dividend, which, when divided by the reference signal divisor, becomes the fractionalized output, is set to the integer input value of 350.

After measuring the output of the simulated prior art circuit, FIG. 9 shows the peak spurious signal occurs at 2.415 MHz with an amplitude of −2.03 dBc. FIG. 10 represents the performance exhibited by a preferred embodiment of the present invention. As FIG. 10 shows, the inventive system and method demonstrates a preferably enhanced noise suppression. In FIG. 10, the peak spurious signal occurs much further out, at 2.3061 MHz, with an amplitude of −11.94 dBc. Therefore, the delta-sigma modulator using a preferred embodiment of the present invention achieves almost a 10 dB improvement in peak noise suppression while using the same circuit area and supply power as the prior art system.

It should be noted that a preferred embodiment of the present invention may comprise multi-order delta-sigma modulators in excess of fourth-order. Fifth, sixth, seventh, or higher-orders of delta-sigma modulators may each incorporate the system and method of a preferred embodiment of the present invention. The present invention beneficially allows a particular order delta-sigma modulator to exhibit improved noise characteristics approaching an ideal delta-sigma modulator without requiring the increased size and complexity of higher-ordered modulators.

Figure 11:
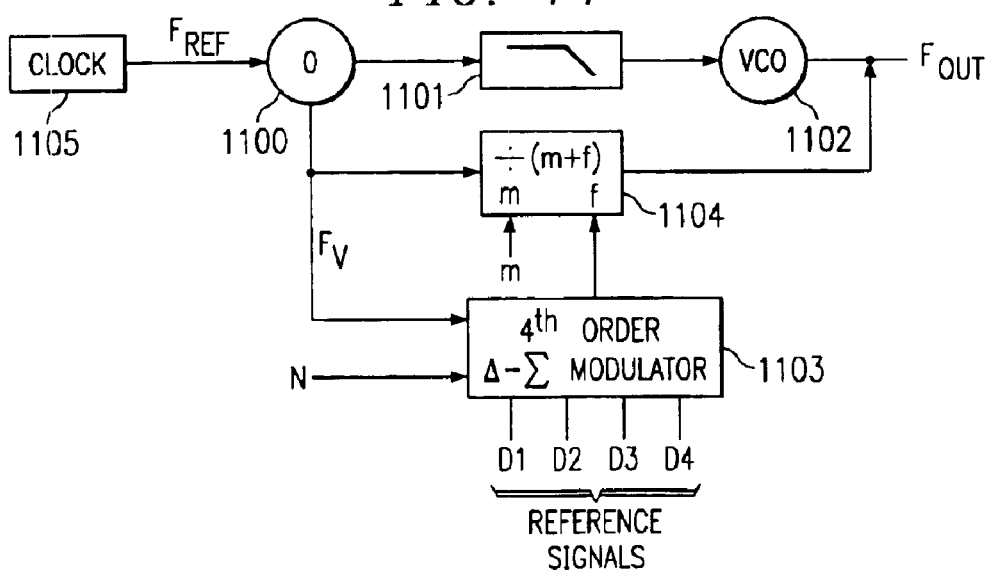
FIG. 11 is a block diagram showing the basic configuration of a fractional-N, PLL frequency synthesizer application using a preferred embodiment of the present invention.

As referenced above, a typical example of an application using a preferred embodiment of the present invention is a fractional-N frequency synthesizer comprising a PLL. FIG. 11 shows a typical configuration of a PLL frequency synthesizer. A PLL frequency synthesizer generally comprises phase detector 1100, low pass filter 1101, voltage controlled oscillator (VCO) 1102, delta-sigma modulator 1103, and frequency divider 1104, which generally feeds back the output of VCO 1102 divided by some number. In operation, reference clock 1105, which is typically a crystal oscillator, feeds a reference signal into the PLL synthesizer. Phase detector 1100 generally detects any phase difference between the reference signal and the divided VCO output signal and creates an error signal, which is typically passed to low pass filter 1101. The filtered error signal is then generally sent to VCO 1102, which typically uses the error signal to either increase or decrease its frequency output to match the frequency of the reference signal and, thus, reduce the error signal. The output of VCO 1102 is typically the output of the synthesizer. VCO 1102 output is generally fed back through frequency divider 1104 which usually divides VCO 1102 output by some divisor. The divisor used by frequency divider 1104 generally comprises an integer value and a fractional value preferably provided by delta-sigma modulator 1103. The carry bit stream produced by delta-sigma modulator 1103 is preferably created using one reference signal value for the first delta-sigma modulator stage D1 and varied reference signal values of the remaining stages' reference signals D2–D4. The newly divided signal is then typically compared with the reference signal at phase detector 1100, to begin the loop again. Therefore, when the divided output from VCO 1102 is equal to the reference signal, the output of the PLL synthesizer equals the reference signal from clock 1105 multiplied by the same divisor used by frequency divider 1104.

In previous delta-sigma-enhanced PLL synthesizers utilizing a constant reference signal within the delta-sigma modulator, spurious signal components around fractional multiples of the reference frequency are introduced to the synthesis loop at the divider. These spurious signal components inject noise into the system, which either degrades the signal output or forces the reduction in effective loop bandwidth of the system to suppress the spurious noise signals. Reducing the bandwidth, therefore, generally negates one of the expected benefits from the use of the delta-sigma modulator. However, with a delta-sigma modulator of a preferred embodiment of the present invention, the preferable lower spurious signal production improves the noise characteristics of the synthesizer output and preferably allows the system to maintain a wider loop bandwidth.

Figure 12:
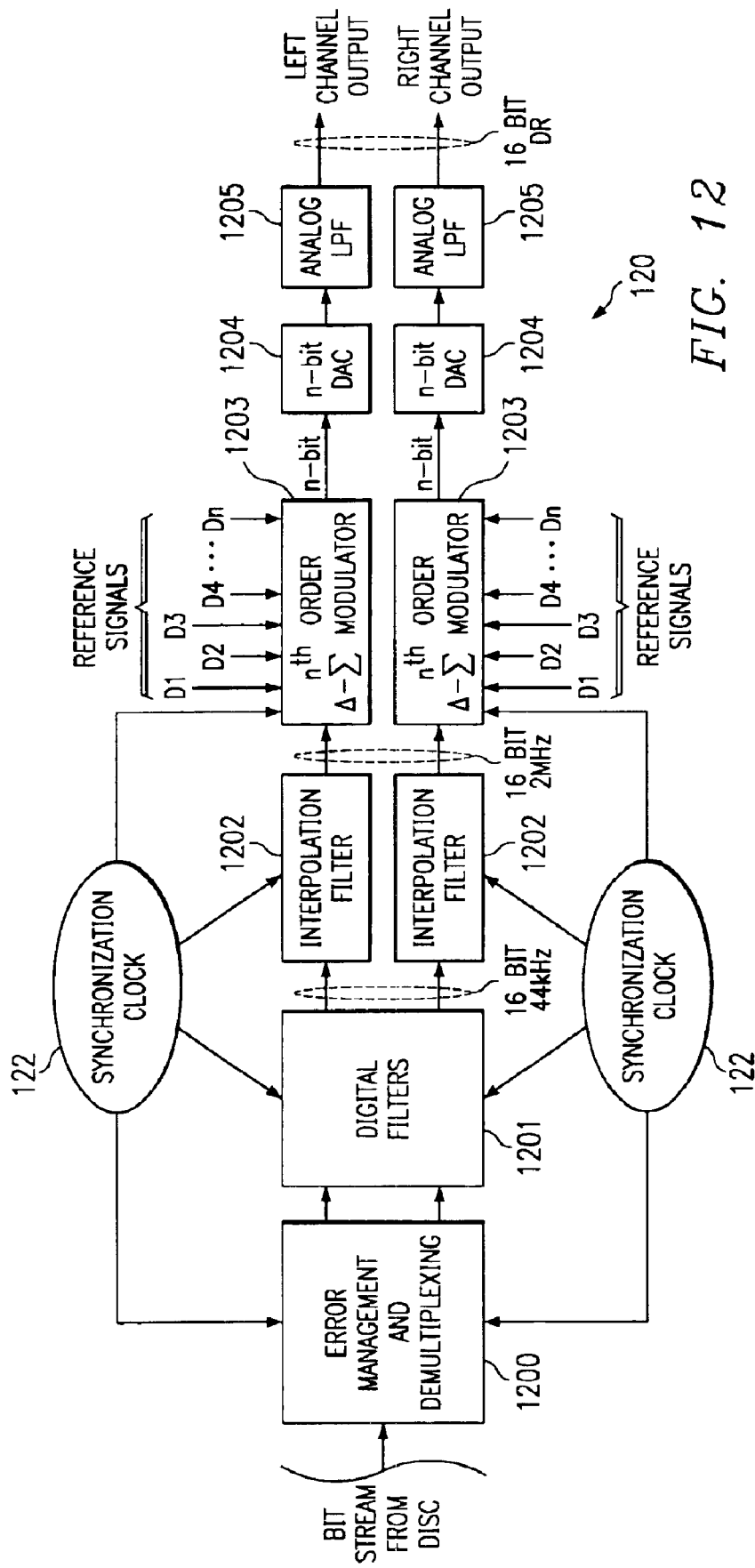
FIG. 12 is a partial block diagram showing a CD player application using a preferred embodiment of the present invention.

Another typical example using a preferred embodiment of the present invention is in the audio processing of a CD player. In its basic operation, a CD player typically takes a stream of digital information and translates that information into an analog signal. In this application, the digital-to-analog conversion may be performed with delta-sigma modulators to take advantage of the noise suppression and noise shaping properties. FIG. 12 shows a partial block diagram of a CD player around the stage of digital-to-analog conversion. A multiplexed bit-stream read from the disc typically enters Error Management and Demultiplexor 1200 for error processing and demultiplexing. The two signals leave Error Management and Demultiplexor 1200 with a typical word length of 16-bits and a sampling rate of 44 kHz. The two demultiplexed signals are then usually filtered through digital filter 1201. The signals are then generally prepared for the delta-sigma modulation process through interpolation filters 1202, which typically increase the sampling rate of the 16-bit signals to 2 MHz. The 16-bit, 2 MHz signals would then preferably enter delta-sigma modulators 1203, configured with the system and method of a preferred embodiment of the present invention. Inventive delta-sigma modulators 1203, which are configured as n-order delta-sigma modulators, convert the 16-bit, 2 MHz signals into an n-bit, 2 MHz signals preferably using the selectively variable reference signals D2–Dn and a synchronization clock signal 122. The number of bits output from the delta-sigma modulator will typically depend on the order of delta-sigma modulator used. For instance, a 4th order MASH delta-sigma modulator produces a 4-bit output. N-bit DACs 1204 then usually convert the n-bit digital signals into analog representations. Output analog low pass filters 1205 will generally take the rough analog signals from n-bit DACs 1204 and perform the necessary filtering to remove the shaped quantization noise and filter the delta-sigma output into a recognizable audio signal.

It should be noted that the fractional-N synthesizer and the CD player are merely two examples of applications that may benefit from the use of the present invention. Other applications that may benefit from the present invention include DVD applications, mini-disc applications, MP3 applications or any other audio play-back or processing equipment. Other applications include modems and ISDN equipment. Any applications that could use a prior art delta-sigma modulator may also use and benefit from the present invention.

It should be noted that the circuit components used to describe the delta-sigma modulator circuit, i.e., summer, integrator, quantizer, DAC, and ADC, are generally well-known in the art. Each of these circuit components may be fabricated using separate subcomponents. For example, an ADC may comprise a comparator, an accumulator, an adder, or other such device. Further, each of these circuit subcomponents may be made up of other subcomponents such as resistors, capacitors, transistors, or other electronic devices. For instance, a DAC may be implemented with a switch, which may itself be built from a diode or transistor circuit, all of which may be fabricated on the same integrated circuit substrate with the rest of the circuit components comprising the delta-sigma modulator. Therefore, the circuit components used to describe the delta-sigma modulator system encompass the subcomponents used to implement the circuit.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A multi-staged delta-sigma modulator comprising:
   a first delta-sigma modulator of a first stage having a first quantizer input reference signal;
   at least one subsequent delta-sigma modulator of at least one subsequent stage cascaded from said first stage, each of said at least one subsequent delta-sigma modulator having a quantizer input reference signal able in relation to said first quantizer input reference signal by at least one least significant bit; and
   a set of differentiators disposed in each of said at least one subsequent stage, an input of said set of differentiators in communication with an output of each of said at least one subsequent stage.

2. The modulator of claim 1 further comprising a final adder for summing outputs of said first stage and an output of each of said set of differentiators.

3. The modulator of claim 2 wherein said modulator is constructed substantially on a single integrated circuit substrate.

4. The modulator of claim 1 wherein an input to said multi-staged delta-sigma modulator is a digital signal.

5. A The modulator of claim 4 wherein said set of differentiators comprises a number of digital differentiators equal to a number of said stages before said subsequent stage on which said set of differentiators is disposed.

6. The modulator of claim 1 wherein said at least one subsequent delta-sigma modulator comprises two or more subsequent delta-sigma modulators.

7. The modulator of claim 6 wherein each of said quantizer input reference signals of said two or more subsequent modulators is different from another of said quantizer input reference signals.

8. A The modulator of claim 1 wherein said first delta-sigma modulator comprises a multi-stage delta-sigma modulator.

9. The modulator of claim 1 wherein at least one of said subsequent delta-sigma modulators comprises a multi-stage delta-sigma modulator.

10. The modulator of claim 1 further comprising:
an interpolation filter prior to said first stage for increasing a sampling rate of an input signal.

11. The modulator of claim 1 wherein said modulator is constructed substantially on a single integrated circuit substrate.

12. A multi-staged delta-sigma modulator comprising:
a first delta-sigma modulator of a first stage having a first reference signal;
at least one subsequent delta-sigma modulator of at least one subsequent stage cascaded from said first stage, each of said at least one subsequent delta-sigma modulator having a reference signal variable in relation to said first reference signal, wherein said at least one subsequent delta-sigma modulator comprises two or more subsequent delta-sigma modulators, wherein each of said reference signals of said two or more subsequent modulators is substantially equal to another of said reference signals and wherein said substantially equal reference signals are different from said first reference signal; and
a set of differentiators disposed in each of said at least one subsequent stage, an input of said set in communication with an output of each of said at least one subsequent stage.

13. A multi-staged delta-sigma modulator comprising:
a first delta-sigma modulator of a first stage having a first reference signal;
at least one subsequent delta-sigma modulator of at least one subsequent stage cascaded from said first stage, each of said at least one subsequent delta-sigma modulator having a reference signal variable in relation to said first reference signal, wherein said at least one subsequent delta-sigma modulator comprises two or more subsequent delta-sigma modulators, wherein at least two of said reference signals of said two or more subsequent modulators are substantially equal to another of said reference signals and wherein said substantially equal reference signals are different from said first reference signal; and
a set of differentiators disposed in each of said at least one subsequent stage, an input of said set in communication with an output of each of said at least one subsequent stage.

14. The modulator of claim 13 wherein said reference signals of a remainder of said two or more subsequent delta-sigma modulators are substantially equal to said first reference signal.

15. A method for modulating signals comprising the steps of:
producing a first modulated signal from an input signal in a first delta-sigma modulator stage using a first reference;
producing subsequent modulated signals in subsequent delta-sigma modulator stages using subsequent references;
differentiating said subsequent modulated signals;
adding said first modulated signal and said subsequent modulated signals into a final output; and
programming at least one of subsequent references to be different from said first reference by at least one significant bit.

16. The method of claim 15 wherein said producing said first modulated signal step comprises the steps of:
integrating an intermediate input signal;
quantizing said integrated input signal using said first reference;
subtracting said quantized signal from said input signal to form said intermediate input signal;
outputting said quantized signal as said first modulated signal;
subtracting said first modulated signal from said integrated input signal to form a stage error signal; and
outputting said stage error signal for use in said producing said subsequent modulated signals step.

17. The method of claim 15 wherein said producing said subsequent modulated signals step comprises the steps of:
integrating a modified quantization error signal;
quantizing said integrated error signal using one of said subsequent references to produce a subsequent modulated signal;
subtracting said subsequent modulated signal from a prior stage error signal to produce said modified quantization error signal; and
outputting said subsequent modulated signal.

18. The method of claim 17 wherein said producing said subsequent modulated signal step of each of said subsequent modulated signals prior to a final subsequent modulated signal further comprises the steps of:
subtracting said subsequent modulated signal from said integrated error signal to form a subsequent stage error signal; and
outputting said subsequent stage error signal.

19. The method of claim 15 further comprising the step of:
increasing a sampling rate of said input signal prior to said step of producing said first modulated signal.

20. A system for modulating signals using a multi-order delta-sigma modulator comprising:
means for receiving an input signal to be modulated;
means for producing a first intermediate modulated signal with a first delta-sigma modulator stage within said multi-order delta-sigma modulator using a first reference signal;
means for producing subsequent intermediate modulated signals with one or more subsequent delta-sigma modulator stages within said multi-order delta-sigma modulator using subsequent reference signals, wherein selected ones of said subsequent reference signals are selectively variable in relation to said first reference signal by at least one least significant bit; and
means for summing said first intermediate modulated signal with said subsequent intermediate modulated signals to produce a modulated output signal.

21. The system of claim 20 further comprising:
means for differentiating said subsequent intermediate modulated signals.

22. The system of claim 20 further comprising:
means for increasing a sampling rate of said input signal prior to said means for producing said first intermediate modulated signal.

23. The system of claim 20 wherein said subsequent reference signals are each different from said first reference signal.

* * * * *